United States Patent [19]
Watson et al.

[11] Patent Number: 6,154,162
[45] Date of Patent: Nov. 28, 2000

[54] DUAL-STAGE SWITCHED-CAPACITOR DAC WITH SCRAMBLED MSB'S

[75] Inventors: Minh V. Watson, Fremont; Crist Y. Lu, Mission Viejo, both of Calif.

[73] Assignee: Centillium Communications, Inc., Fremont, Calif.

[21] Appl. No.: 09/226,455

[22] Filed: Jan. 6, 1999

[51] Int. Cl.[7] .................................................. H03M 1/66
[52] U.S. Cl. ........................ 341/150; 341/145; 341/144
[58] Field of Search ................................... 341/150, 143, 341/144, 153, 145, 172

[56] References Cited

U.S. PATENT DOCUMENTS

| | | | |
|---|---|---|---|
| 4,608,456 | 8/1986 | Paik et al. ............................... | 179/1.5 S |
| 4,713,650 | 12/1987 | Temes et al. ............................ | 340/347 |
| 5,363,102 | 11/1994 | Ferguson, Jr. ..................... | 341/172.341 |
| 5,404,142 | 4/1995 | Adams et al. ............................ | 341/144 |
| 5,412,387 | 5/1995 | Vincelette et al. ....................... | 341/150 |
| 5,621,409 | 4/1997 | Cotter et al. ............................. | 341/156 |
| 5,684,487 | 11/1997 | Timko ..................................... | 341/172 |
| 5,815,046 | 9/1998 | Spilker, Jr. et al. ..................... | 332/103 |
| 5,977,899 | 11/1999 | Adams ..................................... | 341/145 |

OTHER PUBLICATIONS

Goodenough, F. "Technology Breakthrough", Electronic Design, Sep. 2, 1997, pp. 36, 38.
Galton, "Spectral Shaping of Circuit Errors in Digital–to–Analog Converters". IEEE Trans Circuits and Systems–II, vol. 44, No. 10, Oct. 1997, pp. 808–817.

*Primary Examiner*—Brian Young
*Assistant Examiner*—John B Nguyen
*Attorney, Agent, or Firm*—Stuart T. Auvinen

[57] ABSTRACT

A digital-to-analog converter (DAC) uses switched capacitors summed, to an op amp to generate the analog output voltage. Least-significant-bits (LSBs) of the digital input switch a reference voltage to binary-weighted capacitors. The most-significant-bits (MSBs) are thermometer-coded and switch the reference voltage to capacitors that have a same size, double the size of the maximum LSB's capacitor. The thermometer-coded MSB's are scrambled before switching the same-size capacitors so that the assignment of a digital input bit to a capacitor varies from sample to sample. Any variation in capacitances for the same-size capacitors is thus spread to different digital values so that errors do not occur consistently for the same digital values. The scrambler uses radix-2 butterflies to swap bit assignments and thus outputs an even number of signals to the capacitors. Since the thermometer code is an odd number of signals, an extra signal is present that is always driven high or low. Scrambling makes the location of the extra signal unknown. A dummy same-size capacitor is driven to an opposite voltage to compensate for the extra signal. The DAC is further divided into two stages, with the lower stage scaled down to the minimum capacitor size by a linking capacitor to the upper stage.

19 Claims, 5 Drawing Sheets

FIG. 1

PRIOR ART

6 LSB CDAC

DUAL-STAGE SWITCHED-CAPACITOR DAC WITH SCRAMBLED MSB'S

FIELD OF THE INVENTION

This invention relates to digital-to-analog converters (DACs), and more particularly to DACs using switched capacitors and bit-scrambling.

BACKGROUND OF THE INVENTION

Digital-to-analog converters (DACs) are widely used in many applications, including telecomm. Current sources that are switched by the digital bits being converted are common. The switched current generates an analog voltage when passed through a resistor. However, these current-source DACs consume much power.

DACs are sometimes constructed using switched capacitors rather than current sources. The digital bits switch a voltage supply to capacitors with binary-increasing weights. Charge is transferred from these capacitors to an integrating capacitor and amplified by an op amp.

Since charge is simply redistributed with the switched-capacitor DAC, power consumption is significantly reduced compared with current-source DACs. However, precise clocks are needed to time the transfer of charge, and glitches on the output can occur.

Figure 1:
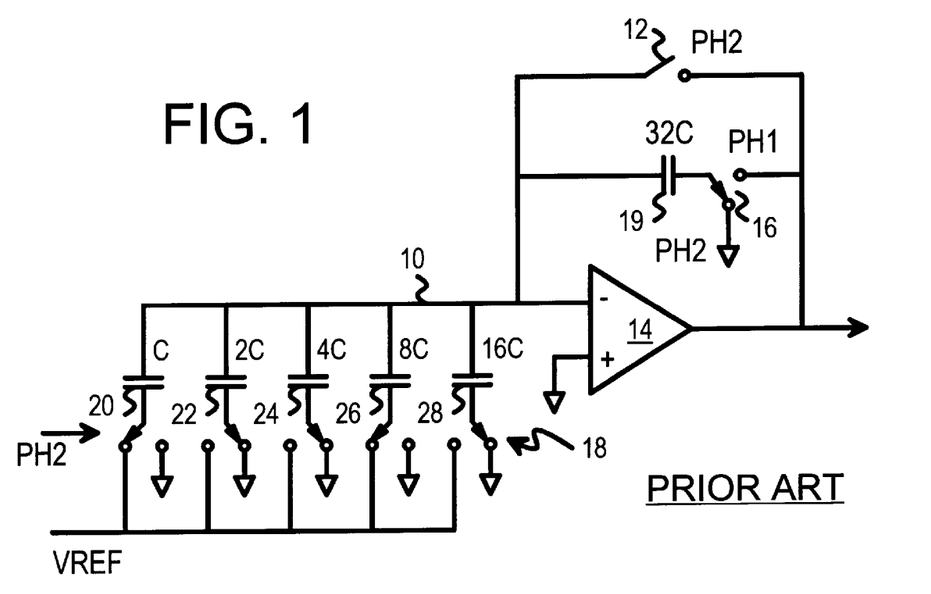
FIG. 1 is a diagram of a prior-art switched-capacitor DAC.

Switched-Capacitor DAC—FIG. 1

FIG. 1 is a diagram of a prior-art switched-capacitor DAC. A two-phase non-overlapping clock is used having phases PH1 and PH2. During PH2, switch 12 closes, shorting the output of op amp 14 to its inverting input. This auto-zeros op amp 14 to its equilibrium point at ground. Summing node 10 is actively driven to ground by the output of op amp 14, discharging all capacitors connected to summing node 10. Integrating capacitor 19 is connected to ground by switch 16, discharging integrating capacitor 19, which has a capacitance of 32C.

Switched capacitors 20, 22, 24, 26, 28 have binary-increasing capacitances C, 2C, 4C, 8C, 16C, where C is the capacitance of the smallest capacitor 20. The backside of switched capacitors 20, 22, 24, 26, 28 are connected to either Vref or ground GND by switches 18, depending on the binary bits. For example, the binary word 01001 connects capacitors 20 and 26 to the higher voltage Vref, since bits 0 and 3 are high. Capacitors 22, 24, 28 are connected to ground, since bits 1, 2, 4 are low.

When connected to Vref, the charge across a capacitor is Vref multiplied by its capacitance. When connected to ground, the charge across a capacitor is zero.

Phase PH2 is known as the precharge phase, since all capacitors are actively charged by being connected to nodes actively driven to set voltages Vref, or ground. Any input-offset or bias in op amp 14 is adjusted for by the auto-zeroing of switch 12.

In the next phase, PH1, switch 12 opens, disconnecting the input and output of op amp 14. Switch 16 connects the back side of integrating capacitor 19 to ground. The total charge is summed and a new voltage appears at the input node of op amp 14. The feedback then forces the voltage at the output of op amp 14 to increase. By increasing the voltage at the output of op amp 14, the voltage at summing node 10 is held to ground.

Switches 18 connect the back sides of capacitors 20, 22, 24, 26, 28 ground during PH1, and to ground or Vref during PH2. This causes charge to be removed from or added to summing node 10. When a switch 18 had connected a capacitor high to Vref during PH2, the switch to a lower voltage during PH1 pulls positive charge from summing node 10. When a switch 18 had connected a capacitor low to ground during PH2, the switch to a higher voltage during PH1 injects positive charge to summing node 10. The amount of charge depends on the capacitance of each capacitors 20, 22, 24, 26, 28 switched high or low.

Since integrating capacitor 19 has a capacitance of 32C, while the total capacitance of capacitors 20, 22, 24, 26, 28 is 31C, summing node 10 is always pulled lower in voltage,. The amount of voltage drop on summing node 10 depends on which capacitors 20, 22, 24, 26, 28 were switched high or low during PH2. The output voltage Vout=(Vref/31C) (D4*16C+D3*8C+D2*4C+D1*2C+D0*C).

When more capacitors 20, 22, 24, 26, 28 were switched high, a larger voltage drop occurs on summing node 10, and the higher the voltage output by op amp 14. Thus a digital value applied to switches 12 during PH2 creates a proportional analog voltage at the output of op amp 14 during the following phase PH1.

Capacitor Mis-Match

One problem with the prior-art switched-capacitor DACs is that of capacitor mis-match. The switched capacitors are typically constructed from polysilicon-oxide-polysilicon layers. Process variations such as layer-misalignment or etch variations can cause variations in capacitance values of different capacitors. These variations may be only a few percent of the total capacitance. However, a 5 % variance of largest capacitor 28 is 16C*0.05 or 0.8C, about the size (1.0C) of the smallest capacitor 20. For larger DACs, such as a 10-bit DAC, the largest capacitor is $C*2^{10}$ or 1024C, and a 5% variation is 51C, many times larger than the smallest capacitors.

It is desired to reduce the effect of these variations in capacitor values, especially for the larger capacitors. What is desired is a switched-capacitor DAC that reduces the effect of capacitance-value error. A multi-bit DAC using charge-redistribution is desired that smoothes out variances of capacitances in the larger capacitors. A low-power DAC with reduced error is desirable.

SUMMARY OF THE INVENTION

An error-scrambling digital-to-analog converter (DAC) has a multi-bit digital input. The digital input has lesser-significant-bit LSB signals and most-significant-bit MSB signals. An analog outputs an analog voltage that is the analog equivalent to a value of the multi-bit digital input.

Binary-weighted capacitors have capacitances increasing by powers of 2. Switches are controlled by the LSB signals to switch a high voltage or a low voltage to each of the binary-weighted capacitors during a precharge phase.

Fixed-size capacitors have a substantially constant capacitance of double a capacitance of a largest of the binary-weighted capacitors. Second switches are controlled by scrambled signals. They switch the high voltage or the low voltage to each of the fixed-size capacitors during the precharge phase. A thermometer coder receives the MSB signals. It generates a thermometer code output. The thermometer code output has a number of active signals equal to a binary value of the MSB signals.

A scrambler is coupled to the thermometer coder. It generates the scrambled signals to the second switches. The scrambler is for scrambling a connection assignment of signals in the thermometer code output to the scrambled signals. Different signals of the thermometer code output control second switches for different fixed-size capacitors during different precharge phases.

A summing node is coupled to the binary-weighted capacitors and to the fixed-size capacitors. It shifts charge during an evaluation phase after the precharge phase. An amplifier receives the summing node as an input. It generates the analog output during the evaluation phase. Thus MSB signals are scrambled and applied to different capacitors.

In further aspects of the invention a bypass capacitor is coupled between the analog output and the summing node. The bypass capacitor shares charge with the binary-weighted capacitors and the fixed-size capacitors during the evaluation phase.

The switches connect the binary-weighted capacitors to the analog voltage during the evaluation phase, and the second switches connect the fixed-size capacitors to the analog voltage during the evaluation phase.

In still further aspects a summing-node switch is coupled to the summing node. It connects the summing node to the amplifier during the evaluation phase, but it connects the summing node to a middle voltage during the precharge phase. The middle voltage is a voltage between the high voltage and the low voltage. The summing node is precharged to the middle voltage.

In other aspects a dummy capacitor is coupled to the summing node. A dummy switch connects the dummy capacitor to the analog output during the evaluation phase, but it connects the dummy capacitor to the low voltage during the precharge phase. Thus the dummy capacitor compensates for an extra one of the fixed-size capacitors.

In other aspects the scrambler includes a random-number generator that generates a different pseudo-random control word for each precharge phase. Levels of crossovers each selectively swap assignment of a pair of signals of the thermometer code output. Each level of crossovers is controlled by a bit of the pseudo-random control word. Thus different signals are paired for different levels of crossovers.

In still further aspects a linking capacitor couples a first-stage output to the summing node. A first stage receives additional LSB signals of the multi-bit digital input. The additional LSB signals have a lower significance than the LSB signals. A first-stage amplifier generates the first-stage output. A first-stage summing node is coupled to an input of the first-stage amplifier. First-stage binary-weighted capacitors have capacitances increasing by powers of 2. First-stage switches are controlled by the additional LSB signals. They switch the high voltage or the low voltage to each of the first-stage binary-weighted capacitors during a first-stage precharge phase. A first-stage switch couples the first-stage output to the first-stage summing node during the firststage precharge phase. The first-stage switch auto-zeros the first-stage amplifier. Thus the additional LSB signals are converted by the first stage and summed in a second stage through the linking capacitor.

DETAILED DESCRIPTION

The present invention relates to an improvement in switched-capacitor digital-to-analog converters (DACs). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the magnitude of the capacitor-matching error can be reduced by using smaller capacitors that average out any errors. For example, when the smallest capacitor has a capacitance C, a 5% error in a 32C capacitor is 0.8C while the same 5% error in a 128C capacitor is 3.2C.

Larger capacitors can be divided into many smaller capacitors. Error matching is improved with these smaller capacitors, since their perimeters more closely match the smallest capacitor.

Smaller capacitors can be used when a thermometer code is used to switch the smaller capacitors. A thermometer code fills in ones from one direction. Each bit switches a same-size capacitor. For example, the thermometer code 11100000 switches on the first 3 of 8 capacitors, while the thermometer code 11111100 switches on 6 of the 8 capacitors. When each capacitor has a value 4C, the total capacitance for 11100000 is 12C, while for 11111100 is 24C. The maximum capacitance is 32C, obtained with the code 11111111.

The inventors have realized that variations can still exist in the many smaller capacitors driven by a thermometer code. These capacitor-to-capacitor variations can be caused by oxide-thickness or quality variations and impurities. Process variations such as etch variation, environment mismatch cause capacitance variations. Errors in the first capacitor driven by the first thermometer-code bit (10000000) are more noticeable than errors in the capacitor controlled by the last thermometer-code bit, since the last bit is activated only for the maximum output (11111111) while first-bit errors are noticed for all output values.

The inventors scramble the assignment of the thermometer code bits to the capacitors so that the same thermometer-code bit is applied to different capacitors for different digital samples being converted. An error in the first capacitor is then less noticeable. Thus over time and many samples, the error caused by one capacitor is spread out.

Rather than scramble and thermometer-code all digital-input bits, only the most-significant bits are coded and scrambled. Dividing the just the largest capacitors into many smaller capacitors driven by a scrambled thermometer code reduces error while minimizing additional complexity and cost.

Figure 2:
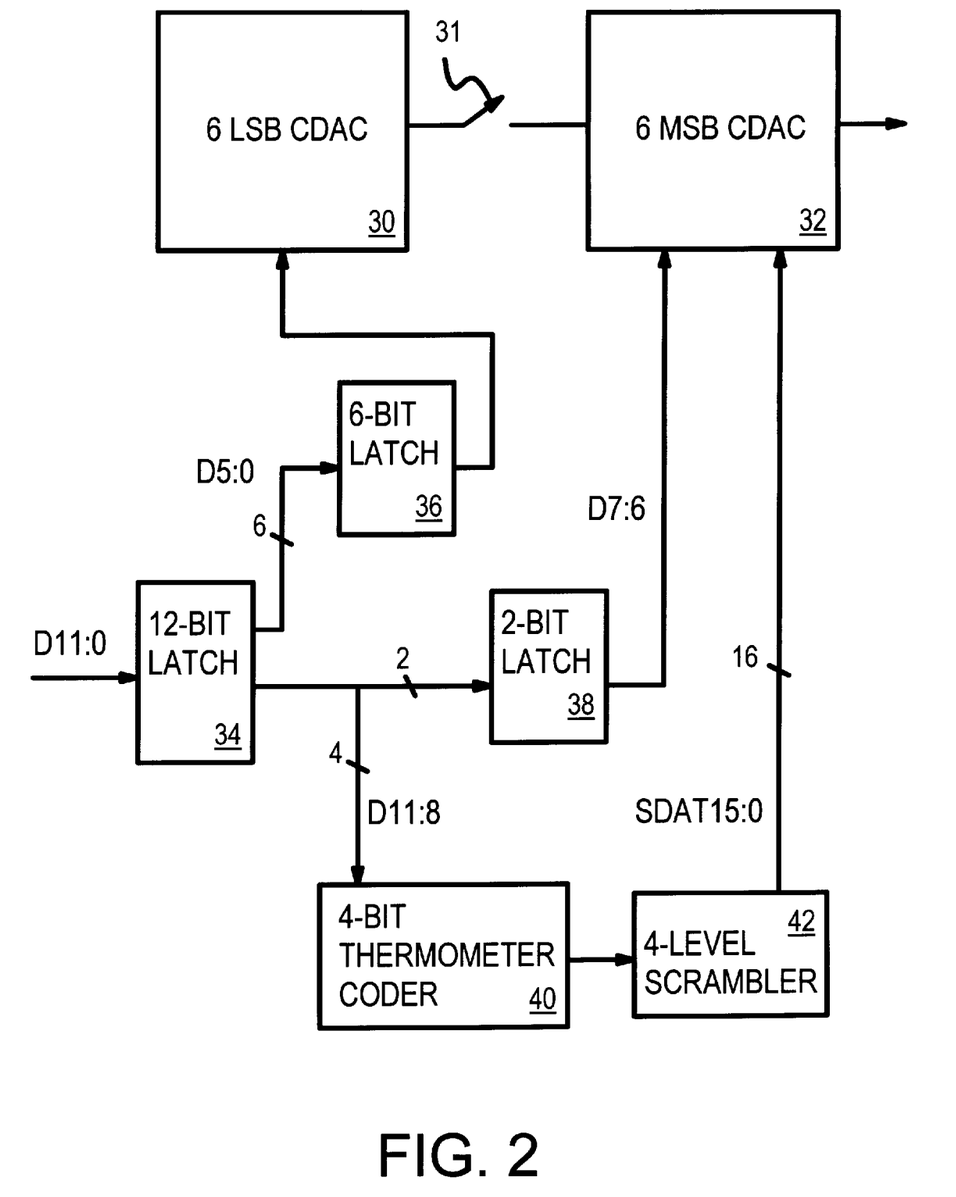
FIG. 2 is a block diagram of a dual-segment scrambling DAC.

Scramble DAC—FIG. 2

FIG. 2 is a block diagram of a dual-segment scrambling DAC. The DAC has two segments or sections—LSB section 30 is a switched-capacitor DAC for the 6 least-significant-bits (LSBs), while MSB section 32 is a switched-capacitor DAC for the 6 most-significant-bits (MSBs). The output of LSB section 30 is applied to a capacitor and input to MSB section 32 by switch 31. Thus a 12-bit DAC is constructed from two 6-bit sections 30, 32.

The 12 digital input bits D11:0 are latched by input latch 34. The 6 LSBs D5:0 from input latch 34 are sent to LSB latch 36 before being applied to the capacitor switches in LSB section 30. The two lesser-significance bits D7:6 of the 6 MSBs from input latch 34 are latched by latch 38 before being applied to the two smallest capacitors in MSB section 32. Each of bits D7, D6 controls one switched capacitor in MSB section 32.

Only the 4 MSBs D11:8 of the 12-bit digital input are thermometer coded and scrambled. Bits D7, D6 are directly applied to capacitor switches. The 4 MSBs from input latch 34 are sent to thermometer coder 40, which generates a 4-bit thermometer code with 15 levels. The thermometer code indicates a binary value from one to 15. Scrambler 42 performs a 4-level scramble of these 16 thermometer bits to generate SDAT15:0, the scrambled data bits. SDAT15:0 each control one of 16 switched capacitors. Each of the 16 capacitors has the same size. The 4-level scramble causes any one thermometer code bit to appear in any one of four SDAT bits, Thus an error in a switched capacitor is spread out among four thermometer input bits.

During phase PH1, LSB section 30 is precharged and the 6 LSB's from latch 36 applied to the capacitor switches. In phase PH2, LSB section 30 evaluates and outputs the summed change to an input capacitor to MSB section 32. MSB section 32 is precharged during this PH2 and the 6 MSBs, including the scrambled and thermometer-coded SDAT15:0, are applied to capacitor switches. Then in the next phase PH1, MSB section 32 evaluates and outputs the analog voltage.

Figure 3:
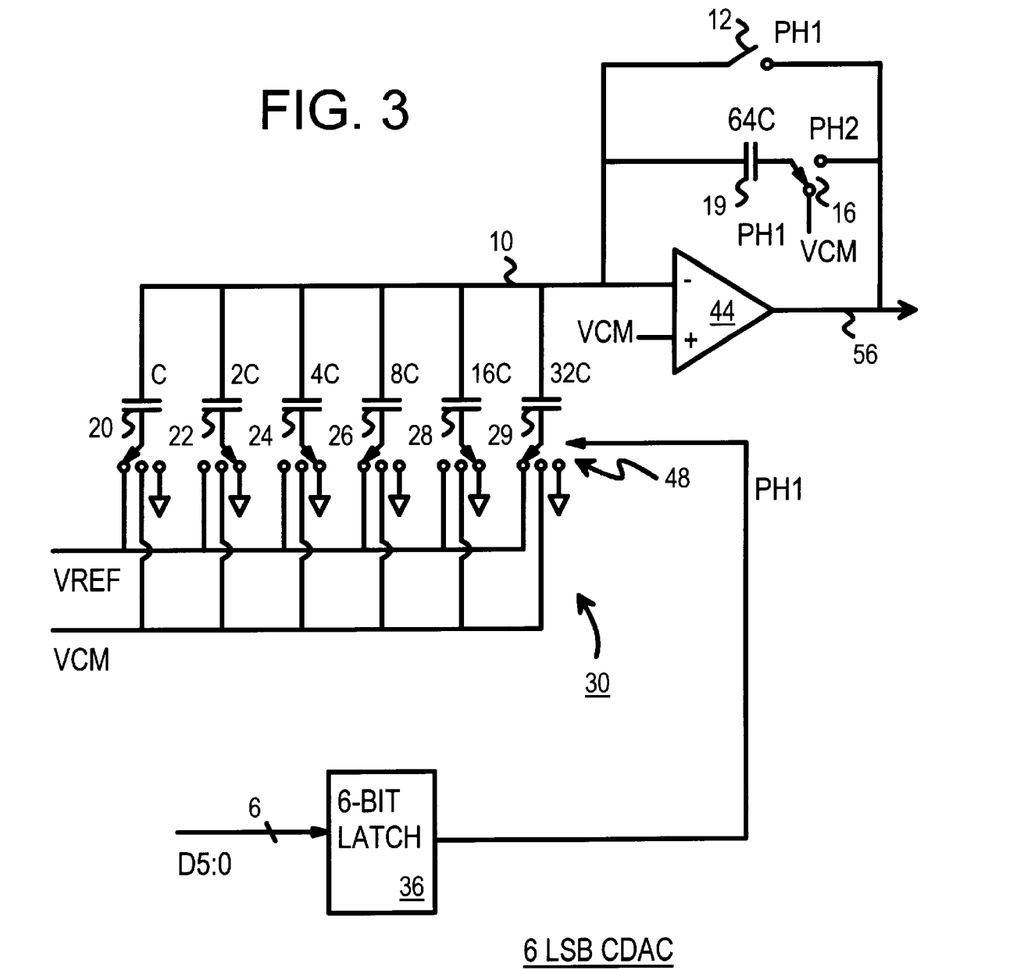
FIG. 3 is a diagram of the LSB section, the first stage of the DAC.

LSB Section—FIG. 3

Figure 4:
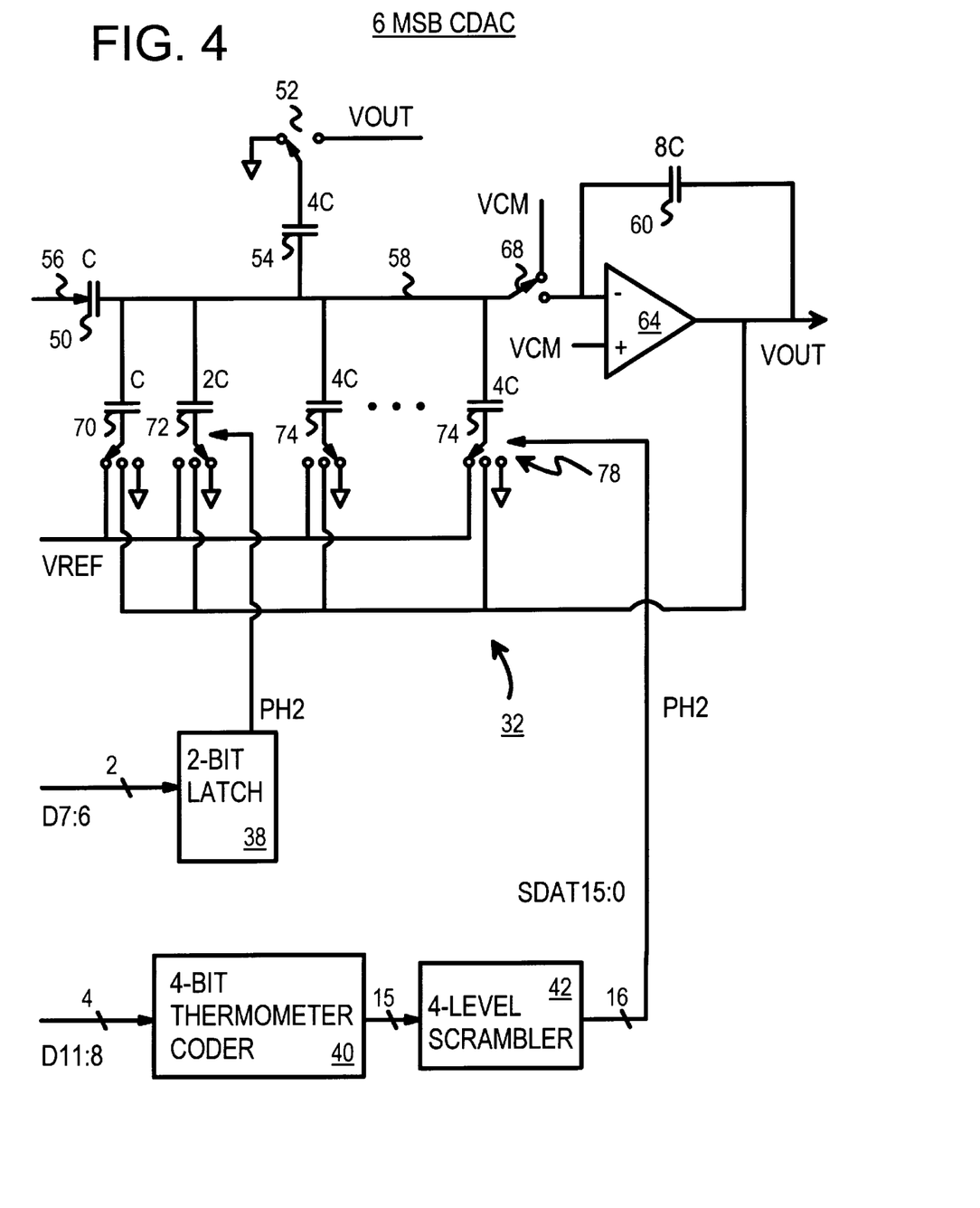
FIG. 4 is a diagram of the MSB section, which is the final stage of the DAC.

FIG. 3 is a diagram of the LSB section, the first stage of the DAC. Precharge occurs during phase PH1, when switch 12 is closed. Integrating capacitor 19 is connected to middle voltage VCM by switch 16. Thus op amp 44 is auto-zeroed to the equilibrium point during PH1, canceling the offset of the op amp. Op amp 44 drives the output of LSB section 30 to MSB section 32 (FIG. 4).

The 6 LSBs D5:0 of the digital input from latch 36 are applied to switches 48 during PH1. Switches 48 connect each one of capacitors 20, 22, 24, 26, 28, 29 to either reference voltage Vref or to ground, depending on the value of each digital input. When a digital-input bit is 1, switch 48 connects the corresponding capacitor high to Vref, when the digital-input bit is 0, switch 48 connects the corresponding capacitor low to ground. FIG. 3 shows the example for the digital input D5:0 of 101001 where capacitors 29, 26, 20 are connected high to Vref, and capacitors 28, 24, 22 are connected low to ground. This produces a total capacitance of 32C+8C+C=47C to Vref and 16C+4C+2C=22C to ground.

During phase PH2, switch 12 opens, allowing op amp 44 to drive the output away from the equilibrium point. Switch 16 closes, connecting integrating capacitor 19 to the output. Switches 48 connect all capacitors 20, 22, 24, 26, 28, 29 to middle voltage VCM (about Vref/2), regardless of the digital inputs D5:0 from latch 36. This injects positive charge to summing node 10 for capacitors that were connected to ground in PH1, but withdraws positive charge from summing node 10 for that were connected to Vref in PH1. This charge is added or subtracted from integrating capacitor 19, which also injects some positive charge into summing node 10 since switch 16 switches from VCM to output Vout. As summing node 10 drops in voltage, the output of op amp 44 rises in voltage. Thus digital bits that were high increase the output 56 voltage while digital bits that were low decrease the output 56 voltage.

Integrating capacitor 19 has a capacitance of 64C, which is larger than the sum of 63C for capacitors 20, 22, 24, 26, 28, 29. Integrating capacitor 19 can thus absorb all the charge from capacitors 20, 22, 24, 26, 28, 29. The voltage of summing node 10 is forced to VCM by the feedback from op amp 44. Since summing node 10 is applied to the inverting input of op amp 44, while VCM is applied to the non-inverting input, the output voltage Vout for output 56 of LSB section 30 is:

Vout(Vref/64C)*(D5*32C+D4*16C+D3*8C+D2*4C+D1*2C+D0*C).

Each of the digital inputs D5:0 thus has a binary-weighted effect on the output voltage Vout. D5 that controls capacitor 29 with a capacitance of 32C has a 32× greater effect than D0 to capacitor 20 with a capacitance of C.

MSB Section Final Stage—FIG. 4

FIG. 4 is a diagram of the MSB section, which is the final stage of the DAC. Output 56 from LBS section 30 of FIG. 3 is applied to linking capacitor 50. During phase PH2, the output voltage Vout from the LSB section is coupled to MSB section 32 through linking capacitor 50. During phase PH1, output 56 is driven to the equilibrium voltage, which is about Vcc/2, which is VCM. Linking capacitor 50 has a capacitance of only C, the value of the minimum capacitor. Thus the total capacitance of up to 63C from the 6 LSB's of LSB section 30 is scaled down to minimum capacitance C by inking capacitor 50. Dividing the DAC into 2 sections allows smaller-size capacitors to be used in each section.

Also during PH2, switches 78 connect capacitors 70, 72, 74, high to Vref or low to ground. Digital inputs D7:6 from latch 38 directly switch capacitors 70 ,72, which have capacitances of C and 2C. Since the maximum value 111111 of the 6 LSB's is 63, linking capacitor 50 with a capacitance of C is equivalent to 63C for the LSB section. Digital bit D6 represents 26 or 64, which is scaled to a capacitance of 1C in the MSB stage. Thus a capacitance of C in the MSB stage is equivalent to a capacitance of 64C in the LSB stage.

The upper 4 MSBs, D11:8, are thermometer-coded by thermometer coder 40 and then scrambled by scrambler 42. Sixteen outputs SDAT15:0 are output by scrambler 42 and drive 16 switches 78. These switches 78 control 16 capacitors 74, each having a capacitance of 4C. The total capacitance of the 16 capacitors 74 is thus 64C.

When switches 78 are connecting capacitors 70, 72, 74 to Vref or ground, switch 68 connects final summing node 58 to middle voltage VCM. Thus both sides of capacitors 70, 72, 74 and linking capacitor 50 are actively driven to constant voltages, allowing the capacitors to be fully charged or discharged. The inverting input of op amp 64 is connected to its output by bypass capacitor 60, which has a value of 8C. This maintains the previous output voltage Vout from op amp 64.

During the next phase PH1, switches 78 connect capacitors 70, 72, 74 to the output voltage Vout from op amp 64. This is the last sample's voltage. Linking capacitor 50 is driven by the op amp in LSB section 30 to the equilibrium voltage which is about VCM. Switch 68 closes, connecting final summing node 58 to the inverting input of op amp 64. Charge sharing occurs from final summing node 58 to bypass capacitor 60. This causes the DAC output voltage to averaged with the previous DAC output voltage. The voltage difference with the non-inverting input of op amp 64 (the middle voltage VCM) is amplified and output as Vout. This adjusts Vout to the proper value for the next sample.

Bypass capacitor 60 holds the previous Vout, and causes op amp 64 to operate as a low-pass unity-gain amplifier. A low-pass response occurs since the 8C capacitance of bypass capacitor 60 holds the previous Vout value. The new DAC Vout voltage is always averaged with the old Vout voltage. The Vout voltage does not change quickly, but several clock cycles are required before the Vout voltage reaches the final voltage. This effect is the same as a low-pass filter since a low-pass filter opposes quick changes. Bypass capacitor 60 sets the corner frequency of the low-pass response of MSB section 32 to the corner frequency Wcorner=(fclk*72C)/8C, where fclk is the PH1 or PH2 sample rate.

A 4-bit binary input is normally converted to a 15-bit thermometer code, since the maximum binary value is 1111 or 15. However, scrambler 42 scrambles pairs of signals and thus must have an even number of bits.

An extra bit is added to make 16 bits output by scrambler 42. This extra bit is always one. Dummy capacitor 54 cancels the charge of the extra ($16^{th}$) bit from scrambler 42 that is always one. Switch 52 connects dummy capacitor 54 to ground during PH2 to cancel the extra capacitor 74 connected high to Vref. Switch 52 connects dummy capacitor 54 to Vout during PH1. Scrambling makes it difficult to determine which of capacitors 74 is driven by the extra bit. Thus dummy capacitor 54 is needed to cancel the extra capacitance for the extra SDAT bit.

The final output from op amp 62, Vout, is:

$$\text{Vout}=(\text{Vref}/72C)(4C*\text{SDAT15}+4C*\text{SDAT14}\ldots+4C*\text{SDAT0}+D7*2C+D6*C+C*\text{Voutlsb})$$

where Voutlsb is the output 56 from LSB section 30 during PH2.

Figure 5:
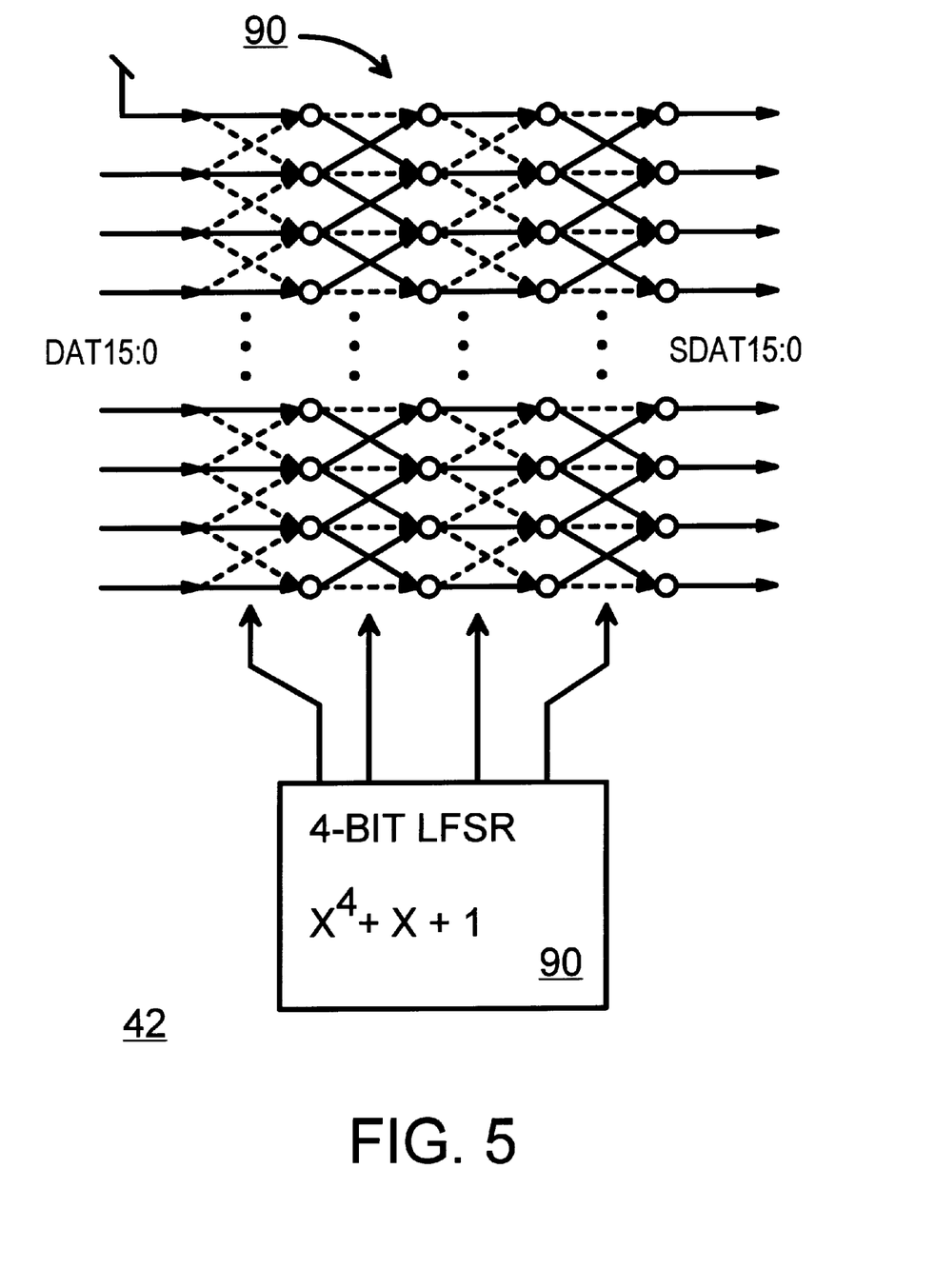
FIG. 5 is a diagram of a 4-level scrambler for the MSB to the DAC.

Scrambler—FIG. 5

FIG. 5 is a diagram of a 4-level scrambler for the MSB to the DAC. The 15 bits DAT14:0 from the thermometer coder are input to switching array 92. A $16^{th}$ signal input to array 92 is connected high to Vcc. This is the extra bit.

Linear-feedback shift register (LFSR) 90 is a free-running random-number generator. It generates a different 4-bit pseudo-random binary word for each PH2. This 4-bit word controls switching array 92. Each bit controls one of the four levels of butterfly crossover switches in switching array 92. When the bit is a one, the crossovers in the column pass the 16 signals through without crossover. However, when the bit is a zero, signals are crossed over or swapped with an adjacent signal. At each of the four levels (columns) of crossover, signals may be passed through or crossed over with another input at that level. Connection of signals from one level to another can also be crossed over so that different signals are adjacent at each level. The signals are preferably not applied to the first level in sequential order so that scrambling of the thermometer-coded inputs occurs for non-adjacent thermometer bits. The final output of scrambler 42 is SDAT15:0, the 16-bit scrambled output to switches 78 of FIG. 4.

ADVANTAGES OF THE INVENTION

The effect of process variations in capacitor values is reduced, especially for the larger capacitors. A switched-capacitor DAC reduces the effect of capacitance-value error. A multi-bit DAC uses charge-redistribution smoothes out variances of capacitances in the larger capacitors. A low-power DAC with reduced error is achieved.

Loading requirements of the digital inputs and of the op amps are reduced using the two-stage architecture. A simplified design is achieved with the invention. Scrambling and thermometer coding on the 4 MSB's reduces spurs from process variations. With a 0.35-micron CMOS process and a data rate of 3.3 MHz, power dissipation is 49 mW from a 3.3-volt power supply.

Alternate Embodiments

Several other embodiments are contemplated by the inventors. For example various circuit modifications are possible. Pipeline and staging registers can be added or the latches can be removed or rearranged. The extra SDAT signal can be tied low rather than high, and the dummy capacitor can be connected to ground rather than to Vref. The reference voltage and middle voltages can be altered, and a low voltage other than ground may be substituted.

The switches to the switched capacitors can be implemented as transistors such as NMOS transistors. The scrambler uses radix-2 butterflies to swap bit assignments and thus outputs an even number of signals to the capacitors. Other radixes may be substituted with the addition of an appropriate number of dummy capacitors. Signals and codes may of course be inverted to active-low signals. For example, inverters may be added to the output of the thermometer coder. The switches then connect the opposite voltage to the switched capacitors.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An error-scrambling digital-to-analog converter (DAC) comprising:

a multi-bit digital input, the digital input having lesser-significant-bit LSB signals and most-significant-bit MSB signals;

an analog output of an analog voltage, the analog voltage being an analog equivalent to a value of the multi-bit digital input;

a plurality of binary-weighted capacitors having capacitances increasing by powers of 2;

a plurality of switches, controlled by the LSB signals, for switching a high voltage or a low voltage to each of the binary-weighted capacitors during a precharge phase;

a plurality of fixed-size capacitors, having a substantially constant capacitance of double a capacitance of a largest of the binary-weighted capacitors;

a plurality of second switches, controlled by scrambled signals, for switching the high voltage or the low voltage to each of the fixed-size capacitors during the precharge phase;

a thermometer coder, receiving the MSB signals, for generating a thermometer code output, the thermometer code output having a number of active signals equal to a binary value of the MSB signals;

a scrambler, coupled to the thermometer coder, for generating the scrambled signals to the second switches, the scrambler for scrambling a connection assignment of signals in the thermometer code output to the scrambled signals, wherein different signals of the thermometer code output control second switches for different fixed-size capacitors during different precharge phases;

a summing node, coupled to the plurality of binary-weighted capacitors and coupled to the plurality of fixed-size capacitors, for shifting charge during an evaluation phase after the precharge phase; and an amplifier, receiving the summing node as an input, for generating the analog output during the evaluation phase, whereby MSB signals are scrambled and applied to different capacitors.

2. The error-scrambling DAC of claim 1 further comprising:
bypass capacitor, coupled between the analog output and the summing node, the bypass capacitor sharing charge with the plurality of binary-weighted capacitors and the plurality of fixed-size capacitors during the evaluation phase.

3. The error-scrambling DAC of claim 2 wherein the plurality of switches connect the binary-weighted capacitors to the analog voltage during the evaluation phase and wherein the plurality of second switches connect the fixed-size capacitors to the analog voltage during the evaluation phase.

4. The error-scrambling DAC of claim 1 further comprising:
a summing-node switch, coupled to the summing node, for connecting the summing node to the amplifier during the evaluation phase, but for connecting the summing node to a middle voltage during the precharge phase, the middle voltage being a voltage between the high voltage and the low voltage,
wherein the summing node is precharged to the middle voltage.

5. The error-scrambling DAC of claim 4 wherein the amplifier has a second input, the second input connected to the middle voltage, the amplifier outputting a voltage difference between the summing node and the middle voltage during the evaluation phase,
whereby the amplifier is a differential amplifier.

6. The error-scrambling DAC of claim 4 further comprising:
a dummy capacitor coupled to the summing node;
a dummy switch for connecting the dummy capacitor to the analog output during the evaluation phase, but for connecting the dummy capacitor to the low voltage during the precharge phase,
whereby the dummy capacitor compensates for an extra one of the fixed-size capacitors.

7. The error-scrambling DAC of claim 6 wherein the thermometer code output has $2^M-1$ signals, wherein M is a number of MSB signals;
wherein the scrambled signals include $2^M$ signals, including an extra signal, the extra signal being assigned to control different ones of the plurality of fixed-sized capacitors;
whereby the dummy capacitor compensates for the extra signal.

8. The error-scrambling DAC of claim 6 wherein the scrambler includes:
a random-number generator for generating a different pseudo-random control word for each precharge phase;
a plurality of levels of crossovers, each level of crossovers for selectively swapping assignment of a pair of signals of the thermometer code output, each level of crossovers controlled by a bit of the pseudo-random control word,
wherein different signals are paired for different levels of crossovers.

9. The error-scrambling DAC of claim 1 further comprising:
a linking capacitor, for coupling a first-stage output to the summing node;
a first stage, receiving additional LSB signals of the multi-bit digital input, the additional LSB signals having a lower significance than the LSB signals;
a first-stage amplifier for generating the first-stage output;
a first-stage summing node coupled to an input of the first-stage amplifier;
a plurality of first-stage binary-weighted capacitors having capacitances increasing by powers of 2;
a plurality of first-stage switches, controlled by the additional LSB signals, for switching the high voltage or the low voltage to each of the first-stage binary-weighted capacitors during a first-stage precharge phase; and
a first-stage switch for coupling the first-stage output to the first-stage summing node during the first-stage precharge phase, the first-stage switch auto-zeroing the first-stage amplifier;
whereby the additional LSB signals are converted by the first stage and summed in a second stage through the linking capacitor.

10. The error-scrambling DAC of claim 9 wherein the first-stage precharge phase occurs during the evaluation phase.

11. An error-spreading digital-to-analog converter (DAC) comprising:
a final stage including:
an op amp for generating a final output voltage, the final output voltage being an analog equivalent to a digital input;
a summing node connected to an input of the op amp, the summing node for charge redistribution;
a thermometer coder, receiving most-significant-bits (MSBs) of the digital input, for generating thermometer-code signals;
a scrambler, coupled to receive the thermometer-code signals, for re-arranging an order of the thermometer-code signals to generate scrambled MSB signals;
MSB switches, controlled by the scrambled MSB signals, for switching between a high voltage and a low voltage; and
MSB capacitors, each having a same nominal capacitance value, connected between the summing node and MSB switches;
wherein the MSB capacitors are connected by the MSB switches to the high voltage or to the low voltage in response to the scrambled MSB signals;
a first stage receiving least-significant-bit LSB bits of the digital input, the first stage including:
a first-stage op amp for generating a LSB output voltage, the LSB output voltage being an analog equivalent to the LSB bits of the digital input;
a first-stage summing node connected to an input of the first-stage op amp, the first-stage summing node for charge redistribution;
LSB switches, coupled to receive LSB bits of the digital input without scrambling and without thermometer coding, for switching between the high voltage and the low voltage; and
LSB capacitors, each having a different binary-weighted capacitance value, connected between the first-stage summing node and LSB switches;
wherein the LSB capacitors are connected by the LSB switches to the high voltage or to the low voltage in response to the LSB bits of the digital input,
whereby unscrambled control signals control capacitors in the first stage but scrambled control signals control capacitors in the final stage and whereby the MSBs of the digital input are thermometer coded and scrambled.

12. The error-spreading DAC of claim 11 wherein the final stage further comprises:

intermediate-significant-bit ISB switches, coupled to receive intermediate-significance bits of the digital input without scrambling and without thermometer coding, for switching between the high voltage and the low voltage; and ISB capacitors, each having a different binary-weighted capacitance value, connected between the summing node and ISB switches;

wherein the ISB capacitors are connected by the ISB switches to the high voltage or to the low voltage in response to the intermediate-significance bits of the digital input, whereby scrambled and unscrambled control signals control capacitors in the final stage.

13. The error-spreading DAC of claim 12 wherein the MSB switches are further for connecting the MSB capacitors to the final output voltage during an evaluation phase.

14. The error-spreading DAC of claim 12 wherein a second input to the op amp is connected to a middle voltage, the middle voltage being between the high voltage and the low voltage.

15. The error-spreading DAC of claim 11 wherein the thermometer-code signals comprise an odd number of signals; and wherein the scrambled MSB signals comprise an even number of signals.

16. The error-spreading DAC of claim 15 wherein the MSB capacitors include an extra MSB capacitor, the extra MSB capacitor being a capacitor in excess of a number of MSB capacitors needed to generate a charge needed for the analog equivalent to the MSBs of the digital input;

wherein the final stage further comprises:

a dummy capacitor, coupled to the summing node, the dummy capacitor having the same nominal capacitance value as the MSB capacitors;

a dummy-capacitor switch for connecting the dummy capacitor to an opposite voltage to a voltage applied to the extra MSB capacitor, the opposite voltage being either the high voltage or the low voltage, whereby the dummy capacitor cancels charge from the extra MSB capacitor.

17. A digital-to-analog converter (DAC) comprising:

a multi-bit digital input, the digital input having lesser-significant-bit LSB signals and most-significant-bit MSB signals;

an analog output of an analog voltage, the analog voltage being an analog equivalent to a value of the multi-bit digital input;

binary-weighted capacitor means for producing capacitances increasing by powers of 2;

switch means, controlled by the LSB signals, for switching a high voltage or a low voltage to each of the binary-weighted capacitor means during a precharge phase;

fixed-size capacitor means, for producing substantially-constant capacitances of double a capacitance of a largest of the binary-weighted capacitor means;

second-switch means, controlled by scrambled signals, for switching the high voltage or the low voltage to each of the fixed-size capacitor means during the precharge phase;

thermometer code means, receiving the MSB signals, for generating a thermometer code output, the thermometer code output having a number of active signals equal to a binary value of the MSB signals;

scramble means, coupled to the thermometer code means, for generating the scrambled signals to the second switch means, the scramble means for scrambling a connection assignment of signals in the thermometer code output to the scrambled signals, wherein different signals of the thermometer code output control second switch means for different fixed-size capacitor means during different precharge phases;

summing means, coupled to the binary-weighted capacitor means and coupled to the fixed-size capacitor means, for shifting charge during an evaluation phase after the precharge phase; and amplifier means, receiving the summing means as an input, for generating the analog output during the evaluation phase, whereby MSB signals are scrambled and applied to different capacitors.

18. The DAC of claim 18 further comprising:

canceling-capacitor means, coupled to the summing means, for canceling charge from a fixed-size capacitor means, whereby some of the charge from the fixed-size capacitor means is cancelled.

19. The DAC of claim 19 further comprising:

unity gain means, coupled to the amplifier means, for operating the amplifier means as a unity-gain amplifier during the evaluation phase.

* * * * *